(12) United States Patent
Harada

(10) Patent No.: US 7,602,044 B2
(45) Date of Patent: Oct. 13, 2009

(54) SEMICONDUCTOR DEVICE HAVING POLYCRYSTALLINE SILICON RESISTORS

(75) Inventor: Hirofumi Harada, Chiba (JP)

(73) Assignee: Seiko Instruments Inc. (JP)

( * ) Notice: Subject to any disclaimer, the term of this patent is extended or adjusted under 35 U.S.C. 154(b) by 194 days.

(21) Appl. No.: 11/386,319

(22) Filed: Mar. 22, 2006

(65) Prior Publication Data

US 2006/0214235 A1    Sep. 28, 2006

(30) Foreign Application Priority Data

Mar. 23, 2005    (JP) .............................. 2005-082890

(51) Int. Cl.
*H01L 23/58* (2006.01)
(52) U.S. Cl. ........................ 257/541; 257/542; 257/543; 257/E27.047
(58) Field of Classification Search ................. 257/541, 257/542, 543, E27.047
See application file for complete search history.

(56) References Cited

U.S. PATENT DOCUMENTS

2006/0081842 A1*    4/2006    Tone et al. .................... 257/48

* cited by examiner

*Primary Examiner*—Phat X Cao
(74) *Attorney, Agent, or Firm*—Adams & Wilks

(57) ABSTRACT

A semiconductor device has a semiconductor substrate, a first insulating film disposed on the semiconductor substrate, and groups of resistors made of polycrystalline silicon and disposed on the first insulating film. At least some of the groups of resistors include at least one dummy resistor made of polycrystalline silicon. A second insulating film is disposed on the resistors and on the at least one dummy resistor of the resistor groups. First metal portions are disposed in respective contact holes disposed in the second insulating film for connecting respective portions of the resistors in the respective resistor groups. Second metal portions are disposed on the second insulating film and over the resistors and the at least one dummy resistor in the respective resistor groups.

16 Claims, 7 Drawing Sheets

SEMICONDUCTOR DEVICE HAVING POLYCRYSTALLINE SILICON RESISTORS

BACKGROUND OF THE INVENTION

The present invention relates to a semiconductor device containing a resistor circuit that is made of polycrystalline silicon.

Resistors employed in semiconductor integrated circuits include diffused resistors, which are obtained by implanting in a single crystal silicon semiconductor substrate an impurity that has a conductivity type reverse to that of the semiconductor substrate, and polycrystalline silicon resistors, which are made of polycrystalline silicon with an impurity implanted therein.

A polycrystalline silicon resistor, in particular, is widely used in a semiconductor integrated circuit due to its advantages of having a small leak current reduced by an insulating film surround the circumference, and having a high resistance caused by defects in grain boundaries.

FIG. 2A and FIG. 2B each show a schematic plan view and a sectional view of a conventional polycrystalline silicon resistor circuit.

The polycrystalline silicon resistor is made by implanting a P type or N type impurity in a polycrystalline silicon thin film that is formed through deposition (for example, LVCD) on an insulating film, and then shaping the film into a resistor shape through photolithography.

The impurity implantation is for setting a resistivity to the polycrystalline silicon resistor, and a P type or N type impurity is implanted at a concentration of $1\times10^{17}/cm^3$ to $1\times10^{20}/cm^3$ in accordance with the desired resistivity.

Terminals are formed by disposing a contact hole and a wiring on each end of the resistor to obtain the potential therebetween. In order to obtain sufficient ohmic contact between the polycrystalline silicon layer and the metal wiring at the terminal, impurities are implanted to have a high concentration equal to or larger than $1\times10^{20}/cm^3$.

Polycrystalline silicon resistors are used in resistor groups 201 to 204 shown in FIG. 3 to form a resistor circuit. Each of the polycrystalline silicon resistors is made of polycrystalline silicon 3 composed of a low concentration impurity region 4 and a high concentration impurity region 5, which are formed in an insulating film 2 on a semiconductor substrate 1, and the electric potentials of a terminal 101 to a terminal 105 are obtained from metal wirings 7 via contact holes 6 provided above the high concentration impurity regions 5 as shown in the schematic plan view of FIG. 2A and the schematic sectional view of FIG. 2B.

To obtain various electric potentials from the resistor circuit, Resistor Group One (201) to Resistor Group Four (204) can have various structures in which each resistor as a unit is connected in series or in parallel to one another. To stabilize the resistance of each resistor group a metal cover on the resistor group is formed and connected to a terminal at one end of the resistor group. This is employed for the following two reasons.

The first reason is to stabilize the polycrystalline silicon resistor. Since polycrystalline silicon is a semiconductor, formation of a wiring or an electrode on a polycrystalline silicon resistor leads to a change in the resistance of the resistor caused by depletion or accumulation of charge in polycrystalline silicon depending on the relative relation between the electric potential of the wiring or the electrode and that of the polycrystalline silicon resistor.

Specifically, existence of a wiring or an electrode having higher electric potential than a polycrystalline silicon resistor immediately above a part of the polycrystalline silicon to which P type impurities were implanted, causes depletion of charge in the P type polycrystalline silicon, which increases the resistance. When the electric potential relation is reversed, the resistance decreases due to the occurrence of accumulation.

The resistance can be kept constant by intentionally arranging a wiring above the polycrystalline silicon, the wiring which has an electric potential close to that of polycrystalline silicon to avoid such resistance shifts. The plan view of FIG. 2A shows an example according to this principle in which an electrode connected to one end of the polycrystalline silicon resistor is extended to the resistor to maintain the electric potential constant.

This phenomenon depends not only to the wiring above the polycrystalline silicon but also to a condition below the polycrystalline silicon; the resistance changes depending on relative relation in electric potentials between the polycrystalline silicon resistor and the semiconductor substrate below the polycrystalline silicon resistor. A method has been known, though not illustrated in drawings, for stabilizing the electric potential in this portion by intentionally forming a diffusion region or the like below the polycrystalline silicon resistor in the same manner as the metal wiring described above.

The second reason is to prevent hydrogen, which affects the resistance of the polycrystalline silicon, from diffusing into polycrystalline silicon in a semiconductor manufacturing process.

Polycrystalline silicon is composed of grains having relatively high crystallinity and grain boundaries of low crystallinity, in other words, grains of high trap-level density, which are located between the grains. The resistance of a polycrystalline silicon resistor is determined mostly by trapping of carriers (electrons or holes) at trap-levels which exist in large number in these grain boundaries. However, when hydrogen, which has a large diffusion coefficient, is generated in a semiconductor manufacturing process, the generated hydrogen atoms easily reach polycrystalline silicon and are trapped at trap-levels, thereby changing the resistance. Processes that generate hydrogen include sintering process, which is performed in hydrogen atmosphere after metal electrode is formed, and plasma nitride film forming process, which uses ammonia gas, a composite of nitrogen and hydrogen.

The resistance shifts of polycrystalline silicon due to hydrogen diffusion can be reduced by covering the polycrystalline silicon resistor with a metal wiring.

The method of stabilizing the resistance of polycrystalline silicon is disclosed, for example, in JP 2002-076281 A.

However, the conventional method for stabilizing the resistance of polycrystalline silicon has a problem in that the metal over the polycrystalline silicon is more susceptible to other factors, for example, charging by plasma, heat, and mechanical stress in a semiconductor manufacturing process than hydrogen. The influence of such factors affects the polycrystalline silicon through the metal placed above the polycrystalline silicon, resulting in the resistance shift.

SUMMARY OF THE INVENTION

To solve the above problem, according to an aspect of the present invention, there is provided a semiconductor integrated circuit, including:

a semiconductor substrate;

a first insulating film formed on the semiconductor substrate;

plural resistors formed on the first insulating film which are made of polycrystalline silicon into the same shape, the polycrystalline silicon having a low concentration impurity region and a high concentration impurity region;

a second insulating film formed on the plural resistors;

a contact hole formed in the second insulating film above the high concentration impurity region;

a metal wiring connected to the contact hole and connecting the plural resistors which are made of polycrystalline silicon; and plural metal portions formed on the second insulating film to cover the low concentration impurity region in plural resistor groups each of which is obtained by connecting one or more of the resistors, the register groups being connected to one another, the semiconductor integrated circuit being characterized in that the plural metal portions have substantially the same area.

Further, according to another aspect of the present invention, a semiconductor integrated circuit is characterized in that second metal portions are each connected to a first metal wiring that connects a resistor group below the metal portion.

Further, according to another aspect of the present invention, a semiconductor integrated circuit is characterized in that the second metal portions are each connected to the semiconductor substrate.

Further, according to another aspect of the present invention, a semiconductor integrated circuit is characterized in that the second metal portions are each connected to a resistor extended from a resistor group below the second metal portion.

The present invention can provide a resistor circuit including stable polycrystalline silicon resistors that are tolerant to the influences of a semiconductor manufacturing process and that show reduction in the resistance shift.

DETAILED DESCRIPTION OF THE PREFERRED EMBODIMENTS

Embodiments of the present invention will be described below with reference to the accompanying drawings.

Figure 1:
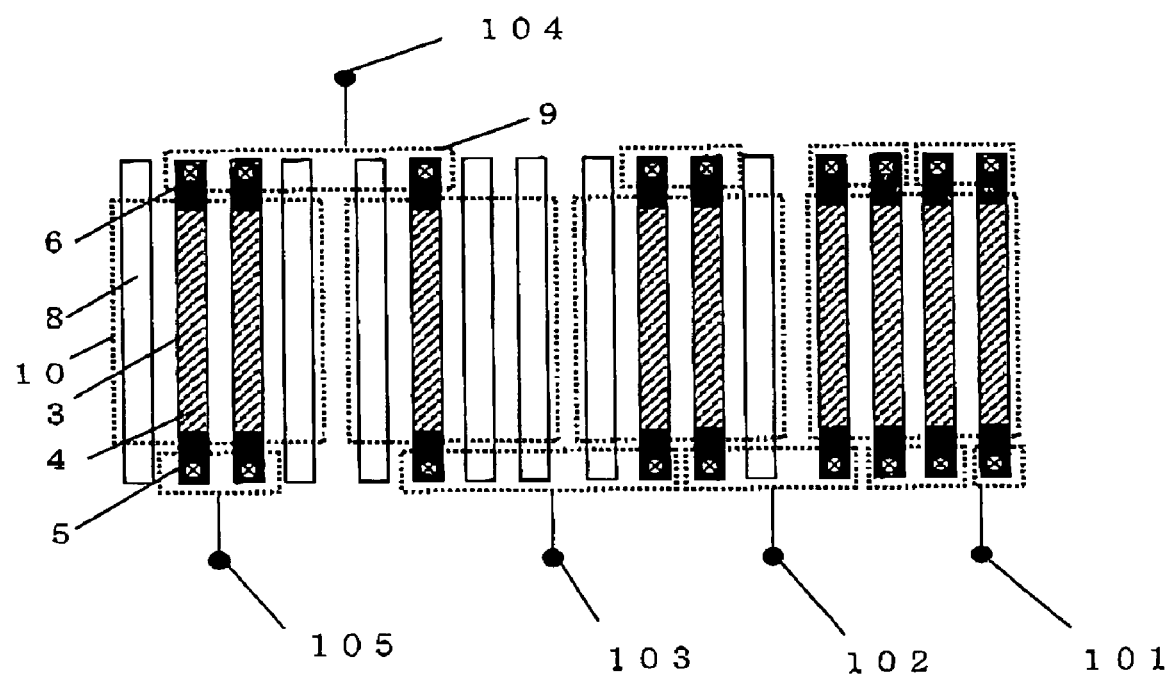
FIG. 1 is a schematic plan view of a polycrystalline silicon resistor circuit according to a first embodiment of the present invention.
Figure 3:
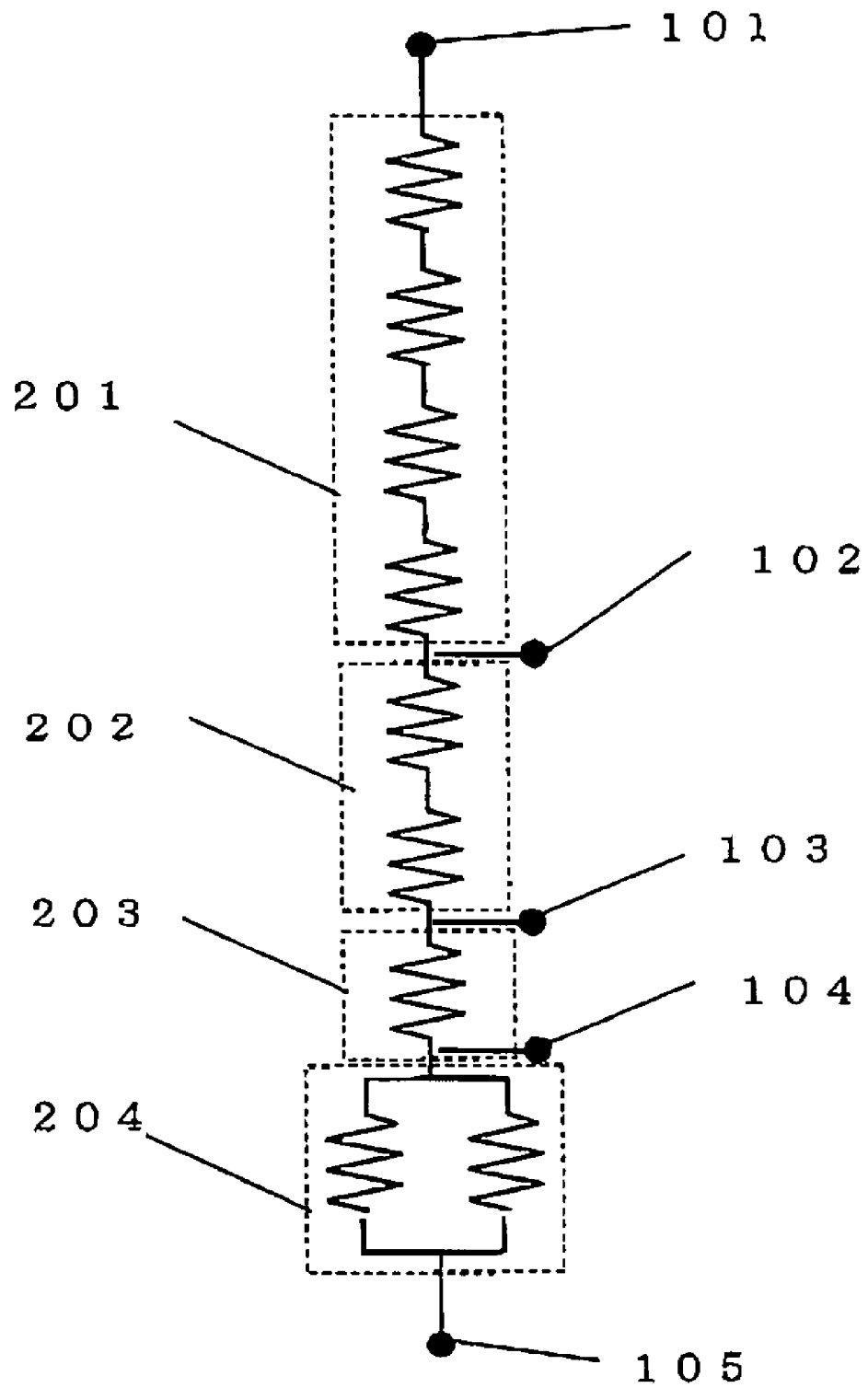
FIG. 3 is an example of a circuit diagram of a resistor circuit.

FIG. 1 shows a first embodiment of the present invention for obtaining a circuit resistor of FIG. 3. As in prior art, Resistor Group One (201) to Resistor Group Four (204) are made of polycrystalline silicon 3 composed of a low concentration impurity region 4 and a high concentration impurity region 5, which are formed in an insulating film 2 on a semiconductor substrate 1, and the electric potentials of a terminal 101 to a terminal 105 are obtained out of a first metal portion 9 serving as a metal wiring via a contact hole 6 above the high concentration impurity region 5.

Unlike the prior art where a metal for covering resistors is formed such that each resistor group is covered with one metal cover whose shape is arbitrary, the present invention uses the first metal portion as a wiring that connects resistor groups to one another, and second metal portions which have the same area and which cover their respective resistor groups.

The area of each of the second metal portions whose areas are the same is determined to cover the resistor group that has the largest area. This is because, in order to reduce resistance shifts due to hydrogen diffusion into polycrystalline silicon during a semiconductor manufacturing process, a low concentration impurity region in every resistor group has to be completely covered with a metal portion while all the metal portions above the resistor groups have to have the same area. Accordingly, it is appropriate to set the area of every metal portion to be the area of a metal portion that covers a resistor group requiring the largest area.

In the case of building the resistor circuit of FIG. 3, for example, the second metal portion that covers resistor group one (201), which uses more unit resistors than any other resistor groups and therefore requires the largest area, has the largest area. Accordingly, the area of each of second metal portions that cover other resistor groups (resistor group two (202) to resistor group four (204)) is set to have the area of the second metal portion above resistor group one.

A space is created between resistor groups when a resistor group that requires a small area is covered with a metal portion having the same area as the one that covers the resistor group requiring the largest area. In such empty spaces below the second metal portions, polycrystalline silicon dummy patterns 8 which have the same shape as the polycrystalline silicon resistors are placed at regular intervals. Maintaining the continuity in shape of the polycrystalline silicon resistors in this way avoids expected shape deviation in etching process caused by the existence of discontinuity in shape of the polycrystalline silicon resistors.

Giving the same area to all second metal portions above the resistor groups which are made of polycrystalline silicon resistors by the above-described method results in uniform reception of influences generated in the semiconductor manufacturing process, maintaining the uniformity of the resistor groups below the second metal portions and protecting, as in prior art, the polycrystalline silicon resistors from the exposure to hydrogen during the semiconductor manufacturing process.

Generally simultaneous formation of the first metal portions and the second metal portions is possible, yielding no additional manufacturing process.

Figure 2A:
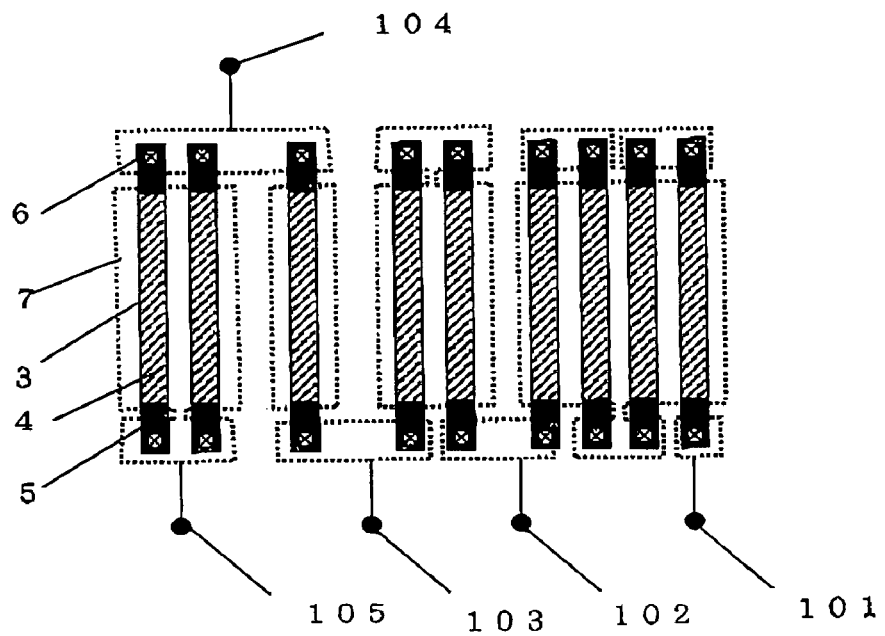
FIG. 2A is a schematic plan view of a conventional polycrystalline silicon resistor circuit.
Figure 2B:
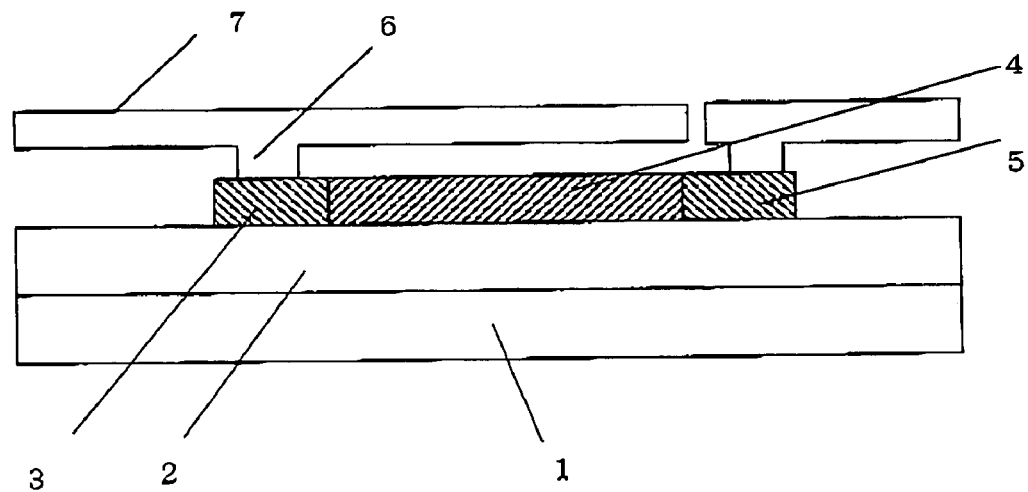
FIG. 2B is a schematic sectional view of a conventional polycrystalline silicon resistor circuit.
Figure 4:
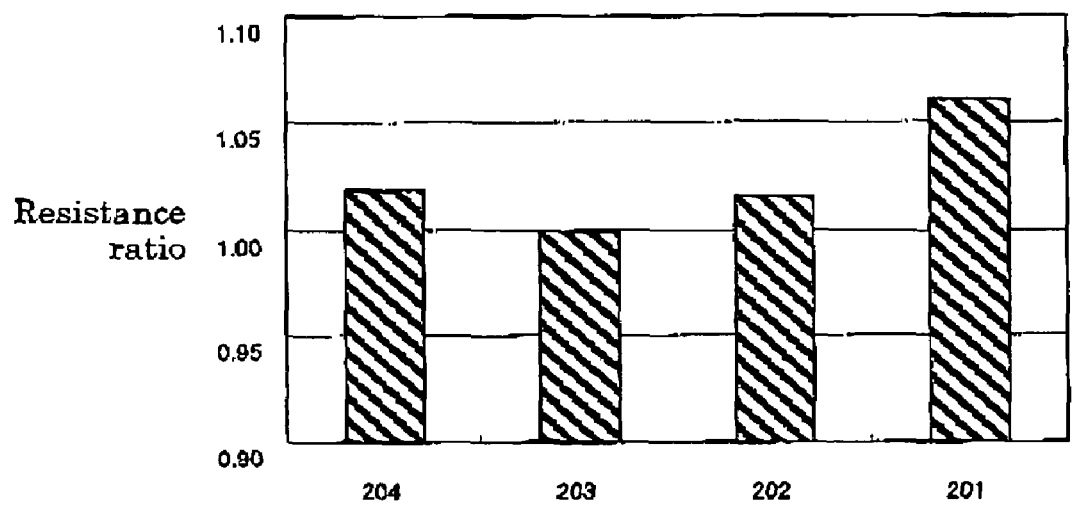
FIG. 4 is a graph showing the resistance ratio of unit resistors in a conventional polycrystalline silicon resistor circuit.

FIG. 4 shows a comparison in the resistance ratio of the unit resistor in each resistor group of the resistor circuit of FIG. 3 whose layout was made according to a conventional manner as shown in FIG. 2A and was manufactured through a certain manufacturing process. According to FIG. 4, all unit resistor should have the same resistance ration though the unit resistor in resistor group one (201), which is covered by a metal wiring having the largest area, has the highest resistance ratio and the unit resistor in resistor group three (203), which is covered with a metal wiring having the smallest area, has the lowest resistance ratio.

Figure 5:
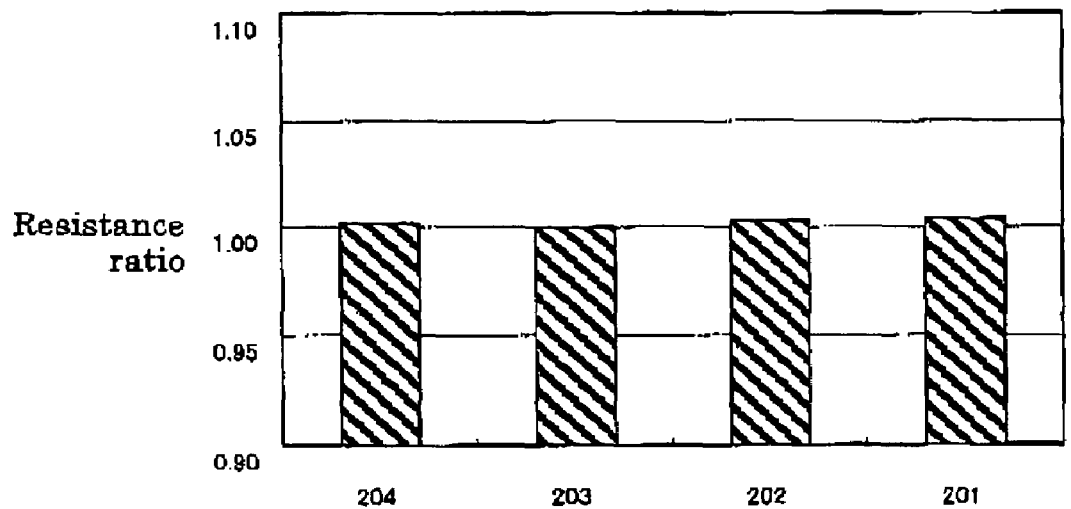
FIG. 5 is a graph showing the resistance ratio of unit resistors in a polycrystalline silicon resistor circuit according to the present invention.

In contrast, as shown in FIG. 5, unit resistors of a resistor circuit that employs the layout of FIG. 1 according to the present invention have substantially the same resistance ratio in any resistor group. The effectiveness of the present invention is thus obvious. The second metal portions in this embodiment are not connected to anywhere and are electrically floating.

Figure 6:
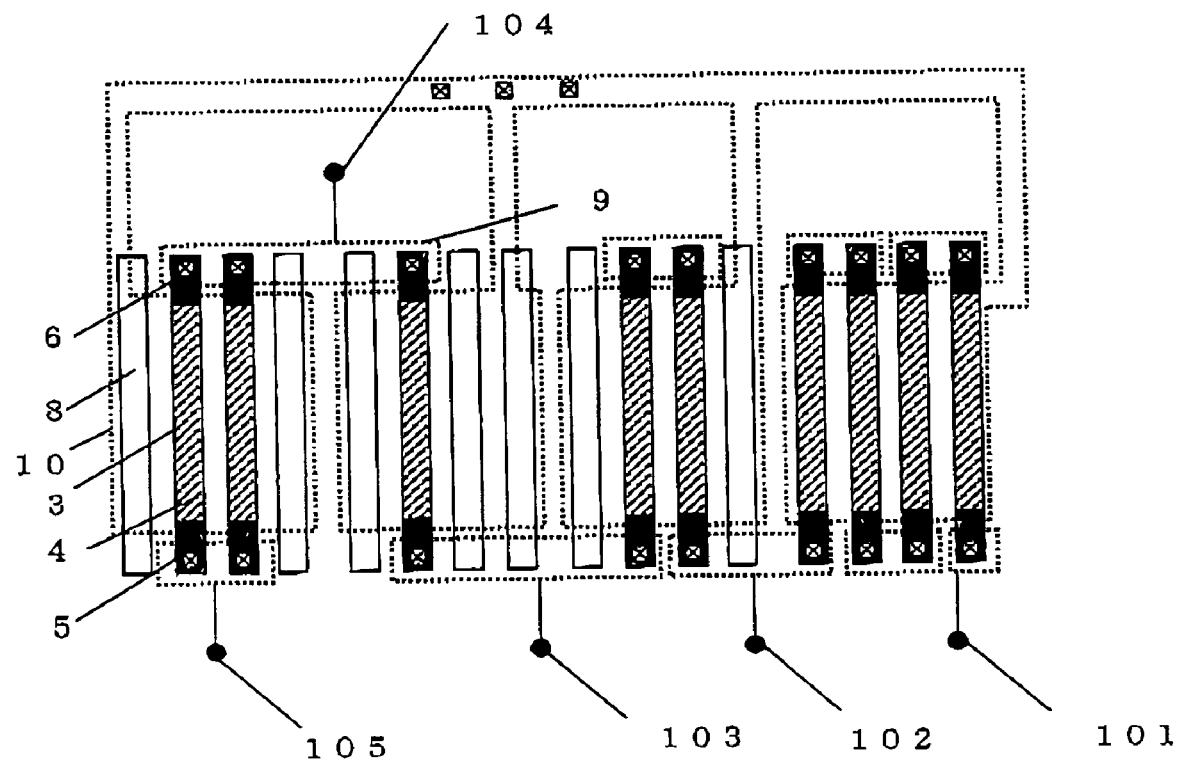
FIG. 6 is a schematic plan view of a polycrystalline silicon resistor circuit according to a second embodiment of the present invention.

FIG. 6 shows a second embodiment of the present invention for obtaining the resistor circuit of FIG. 3. In the second embodiment, each of the second metal portions, which is electrically floating in the first embodiment, is connected to the semiconductor substrate through contact holes in a region outside of the resistor groups. This has an effect of releasing process charge and accumulated heat, both of which are generated during a semiconductor manufacturing process, to the semiconductor substrate having a large capacity.

In this embodiment even if the external disturbance such as process charge or heat fluctuates, resistance fluctuation caused by the fluctuation of external disturbances can be reduced to the minimum by releasing the charge or heat instantly to the substrate.

In short, by uniforming fluctuation due to the influence of external disturbances in a semiconductor manufacturing process while reducing the influence of the fluctuation of external disturbances themselves to the minimum, resistance fluctuation can be reduced and a resistor circuit composed of stable polycrystalline silicon resistors that have reduced resistance fluctuation can be provided.

Figure 7:
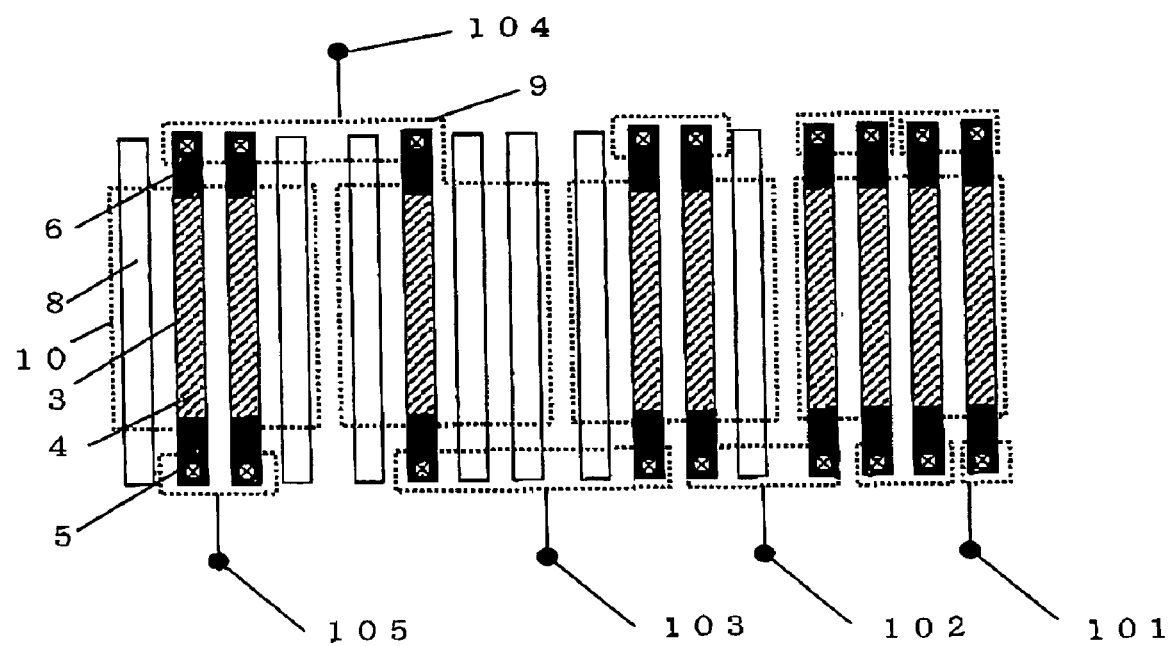
FIG. 7 is a schematic plan view of a polycrystalline silicon resistor circuit according to a third embodiment of the present invention.

FIG. 7 shows a third embodiment of the present invention for obtaining the resistor circuit of FIG. 3. In the third embodiment, each second metal portion, which is electrically floating in the first embodiment, is connected to one end of resistors belonging to a resistor group that is covered with the second metal portion. This structure makes it possible to close the difference between the electric potential of a resistor group that is generated when the resistor circuit starts operation and the electric potential of the second metal portion above the resistor group, and to reduce resistance fluctuation due to the depletion or accumulation effect of polycrystalline silicon resistors which is caused by the electric potential difference between the two.

Thus, fluctuation due to the influence in a semiconductor manufacturing process can be made uniform and resistance fluctuation due to the depletion or accumulation effect of resistor groups can be controlled. A resistor circuit composed of stable polycrystalline silicon resistors that have reduced resistance fluctuation can thus be provided.

Figure 8:
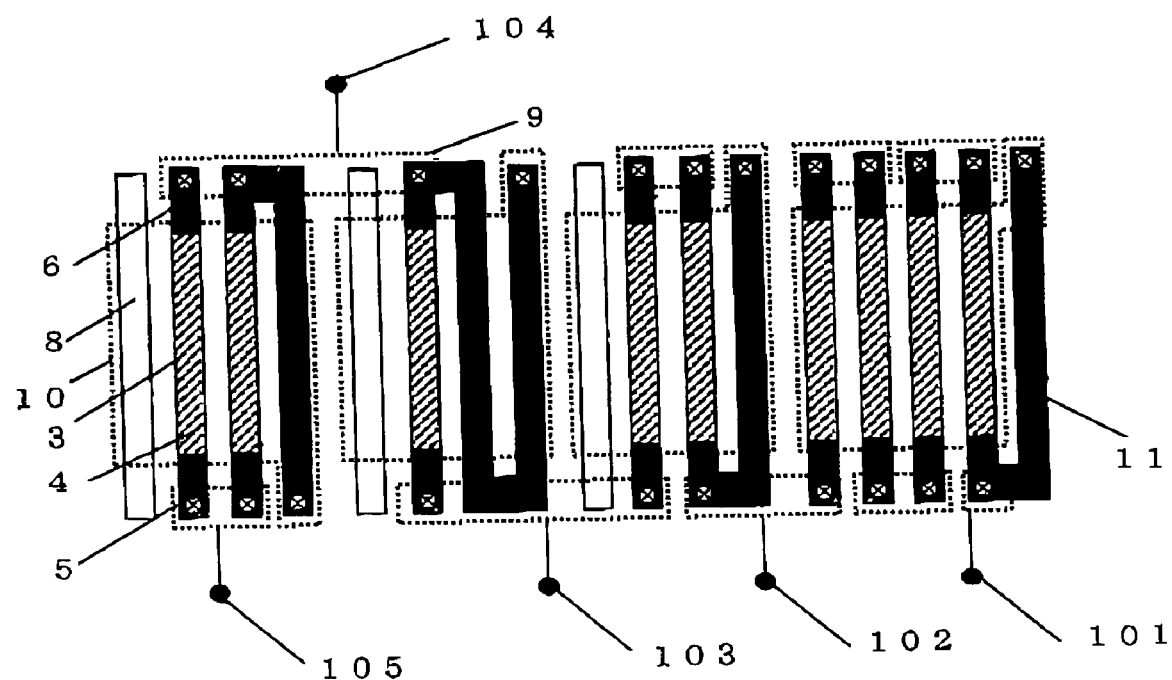
FIG. 8 is a schematic plan view of a polycrystalline silicon resistor circuit according to a fourth embodiment of the present invention.

FIG. 8 shows a fourth embodiment of the present invention of obtaining the resistor circuit of FIG. 3. In the fourth embodiment, each second metal portion, which is connected to one end of resistors belonging to a resistor group that is covered with the second metal portion in the third embodiment, is connected to a resistor end 11, which is extended from one end of the resistors belonging to the resistor group that the second metal wiring covers. As in the third embodiment, this structure makes the electric potential of each second metal wiring equal to that of a resistor group below the second metal portion. The structure thus reduces resistance fluctuation due to the depletion or accumulation effect, which is caused by the electric potential difference generated between the two when the resistor circuit operates, in polycrystalline silicon resistors.

This structure is also capable of easing process charge and accumulated heat both of which are generated during a semiconductor manufacturing process by releasing the process charge and heat to an extended portion of a resistor that has a certain volume. Even if the external disturbance such as process charge or heat fluctuates, resistance fluctuation caused by the external disturbance can be reduced to the minimum through minimizing the effect by releasing the charge or heat instantly to the substrate.

This embodiment can give an effect of uniforming fluctuation due to the influence of external disturbances in a semiconductor manufacturing process while reducing the influence of the fluctuation of external disturbances themselves to the minimum as well as controlling resistance fluctuation due to the depletion or accumulation effect in resistor groups. A resistor circuit having stable polycrystalline silicon resistors having reduced resistance fluctuation can thus be provided.

What is claimed is:

1. A semiconductor device comprising:
a semiconductor substrate;
a first insulating film disposed on the semiconductor substrate;
a plurality, of resistors made of polycrystalline silicon and disposed on the first insulating film, each of the resistors having a low concentration impurity region and high concentration impurity regions at respective opposite ends of the low concentration impurity region;
at least one dummy resistor made of polycrystalline silicon and disposed on the first insulating film;
a second insulating film disposed on the plurality of resistors and on the at least one dummy resistor;
a contact hole disposed in the second insulating film on each of the high concentration impurity regions;
a metal wiring connected to the contact hole for connecting each portion of the plurality of resistors; and
a plurality of metal portions each having substantially the same area and disposed on the second insulating film, the areas of the plurality of metal portions defining respective regions including at least one region overlying a preselected number of the plurality of resistors and at least one region overlying a combination of the plurality of resistors and the at least one dummy resistor in a number equal to the preselected number, the plurality of metal portions covering the low concentration impurity regions of the plurality of the resistors.

2. A semiconductor device according to claim 1; wherein the plurality of resistors have the same shape.

3. A semiconductor device according to claim 1; wherein the plurality of resistors comprises a plurality of resistor groups each having one or more resistors.

4. A semiconductor device according to claim 2; wherein the plurality of resistors comprises a plurality of resistor groups each having one or more resistors.

5. A semiconductor device according to claim 1; wherein the plurality of metal portions are in an electrically floating state.

6. A semiconductor device according to claim 1; wherein each of the metal portions is connected to the semiconductor substrate.

7. A semiconductor device according to claim 1; wherein the plurality of resistors comprises a plurality of groups of the resistors, and the plurality of metal portions cover the low concentration impurity regions of the resistors in the respective resistor groups; and wherein the metal portions are connected to one end of the resistors in the respective resistor groups.

8. A semiconductor device according to claim 1; wherein the plurality of resistors comprises a plurality of groups of the resistors, and the plurality of metal portions cover the low concentration impurity regions of the resistors in the respective resistor groups; and wherein the metal portions are connected to a resistor extending from the respective resistor groups.

9. A semiconductor device comprising:
   a semiconductor substrate;
   a first insulating film disposed on the semiconductor substrate;
   a plurality of groups of resistors made of polycrystalline silicon and disposed on the first insulating film, at least some of the groups of resistors including at least one dummy resistor made of polycrystalline silicon;
   a second insulating film disposed on the plurality of resistors and on the at least one dummy resistor of the resistor groups;
   a plurality of contact holes disposed in the second insulating film;
   first metal portions disposed in the respective contact holes for connecting respective portions of the resistors in the respective resistor groups; and
   second metal portions disposed on the second insulating film and each having substantially the same area as one another, the areas of the second metal portions defining respective regions overlying an equal number of a combination of the plurality of resistors and the at least one dummy resistor in the respective resistor groups.

10. A semiconductor device according to claim 9; wherein each of the plurality of resistors has a low concentration impurity region and a pair of high concentration impurity regions at respective opposite ends of the low concentration impurity region; wherein the contact holes are disposed on the respective high concentration impurity regions of the plurality of resistors; and wherein the second metal portions cover the respective low concentration impurity regions of the plurality of resistors.

11. A semiconductor device according to claim 9; wherein all of the second metal portions have substantially the same area.

12. A semiconductor device according to claim 9; wherein the combined total number of the plurality of resistors and the at least one dummy resistor is the same for each of the resistor groups.

13. A semiconductor device according to claim 9; wherein the second metal portions are in an electrically floating state.

14. A semiconductor device according to claim 9; wherein each of the second metal portions is connected to the semiconductor substrate through contact holes in a region outside of the corresponding electrode groups.

15. A semiconductor device according to claim 9; wherein the second metal portions are connected to one end of the plurality of resistors in the respective resistor groups.

16. A semiconductor device according to claim 9; wherein the second metal portions are connected to respective resistors extending from the respective resistor groups.

* * * * *

UNITED STATES PATENT AND TRADEMARK OFFICE
CERTIFICATE OF CORRECTION

| | |
|---|---|
| PATENT NO. | : 7,602,044 B2 |
| APPLICATION NO. | : 11/386319 |
| DATED | : October 13, 2009 |
| INVENTOR(S) | : Hirofumi Harada |

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 229 days.

Signed and Sealed this

Fifth Day of October, 2010

David J. Kappos
*Director of the United States Patent and Trademark Office*